(12) United States Patent
Lee

(10) Patent No.: US 11,656,186 B2
(45) Date of Patent: May 23, 2023

(54) WAFER AND METHOD FOR ANALYZING SHAPE THEREOF

(71) Applicant: SK Siltron Co., LTD., Gyeongsangbuk-do (KR)

(72) Inventor: Chung Hyun Lee, Seoul (KR)

(73) Assignee: SK SILTRON CO., LTD., Gyeongsangbuk-Do (KR)

( * ) Notice: Subject to any disclaimer, the term of this patent is extended or adjusted under 35 U.S.C. 154(b) by 305 days.

(21) Appl. No.: 17/069,179

(22) Filed: Oct. 13, 2020

(65) Prior Publication Data

US 2022/0018788 A1   Jan. 20, 2022

(30) Foreign Application Priority Data

Jul. 16, 2020  (KR) .......................... 10-2020-0088216

(51) Int. Cl.
| | |
|---|---|
| *G01N 21/95* | (2006.01) |
| *G01B 11/24* | (2006.01) |
| *G06T 7/00* | (2017.01) |
| *H01L 21/66* | (2006.01) |

(52) U.S. Cl.
CPC ......... *G01N 21/9501* (2013.01); *G01B 11/24* (2013.01); *G06T 7/0006* (2013.01); *H01L 22/12* (2013.01); *H01L 22/20* (2013.01); *G06T 2207/30148* (2013.01)

(58) Field of Classification Search
CPC ........... G01N 21/9501; G01N 21/9503; G01N 21/9515; G01B 11/24; G01B 11/06; G01B 2210/56; G01B 11/0616; G06T 7/0006; G06T 2207/30148; H01L 22/12; H01L 22/20; H01L 29/0657
See application file for complete search history.

(56) References Cited

U.S. PATENT DOCUMENTS

2022/0018788 A1 *  1/2022  Lee .................. H01L 22/12

FOREIGN PATENT DOCUMENTS

| KR | 10-2019-0049287 | 5/2019 |
|---|---|---|
| KR | 10-1992778 | 6/2019 |

* cited by examiner

*Primary Examiner* — Jack S Chen
(74) *Attorney, Agent, or Firm* — KED & Associates, LLP

(57) ABSTRACT

Disclosed is a method for analyzing a shape of a wafer. The method includes measuring external shapes of a plurality of wafers, detecting a first point having a maximum curvature in an edge region of each wafer from measured values acquired in the measuring the external shapes of the wafers, detecting a second point spaced apart from the first point in a direction towards an apex of a corresponding one of the wafers, measuring a first angle formed between a first line configured to connect the first point and the second point and a front side of the corresponding one of the wafers, forming a thin film layer on a surface of each wafer, measuring a thickness profile of the thin film layer, and confirming a wafer in which a maximum value of the thickness profile of the thin film layer is the smallest among the wafers.

5 Claims, 4 Drawing Sheets

WAFER AND METHOD FOR ANALYZING SHAPE THEREOF

This application claims the benefit of Korean Patent Application No. 10-2020-0088216, filed on Jul. 16, 2020, which is hereby incorporated by reference as if fully set forth herein.

BACKGROUND OF THE INVENTION

Field of the Invention

The present invention relates to a wafer and a method for analyzing the shape thereof, and more particularly, to a method for confirming the shape of a wafer on which a photoresist or the like is appropriately stacked in a wafer fabrication process.

Discussion of the Related Art

In general, semiconductor devices are formed on a wafer. Here, in order to achieve high integration and high yield of the semiconductor devices, the edge of the wafer requires high purity and also must have a shape appropriate for a semiconductor device fabrication process. For this purpose, a practical and simple method for analyzing the shape of the edge of the wafer is demanded.

For example, one of the most important mathematical parameters for determining the shape of the edge of the wafer is curvature, and the overall curvature formed by the edge and the front side of the wafer must be as small as possible. The reason for this is that, only if the curvature of the wafer is small, the front side of the wafer and the edge of the wafer may be smoothly formed without any boundary therebetween.

When the curvature formed by the edge and the front side of the wafer is not small, fatal problems, such as non-uniform coating of the wafer with a photoresist (PR) or the like, may occur in a process for fabricating semiconductor devices on the wafer.

As one of conventional methods for analyzing the shape of the edge of a wafer, the shape of the wafer is analyzed using optical phenomena, such as laser scatting. However, such a conventional method requires expensive equipment which must be maintained in fine alignment, and imposes the technical requirement to reduce the size of a laser spot in order to perform very fine analysis corresponding to calculation of the curvature of the edge.

In order to solve these problems, Korean Patent Unexamined Publication No. 10-2019-0049287 discloses technology for dividing the edge region of a wafer, measuring cross-sectional images and then measuring a profile.

FIG. 1 is a view illustrating a conventional method for analyzing the shape of a wafer.

As shown in this figure, in this conventional method, the shape of the wafer W is analyzed using a reference point P0 and first to third points P1 to P3.

The reference point P0 may be disposed so as to have a height about equal to or slightly lower than the height of a front side f in a bulk region B, and the reference point P0 may be considered as a start point of an edge region E.

The first point P1 may be a point on a bevel front side WBf which has the maximum curvature. The second point P2 may be a point on the bevel front side WBf which is adjacent to the first point P1. Further, the third point P3 may be a point on the bevel front side WBf which is adjacent to the second point P2.

A first line connecting a point on the bevel front side WBf in the edge region E of the wafer W which has the minimum radius of curvature, i.e., the first point P1 having the maximum curvature, and the second point P2 is measured. Further, an angle θ11 formed by the first line and the front side f in the bulk region B of the wafer W is measured.

However, the above-described conventional method for analyzing the shape of the wafer has the following problems.

First, the front side f, the reference point P0 and the first and second points P1 and P2 are used to analyze the shape of the wafer, and thus, there is a high likelihood of occurrence of an error due to use of the four positions.

Second, after the edge region of the wafer is divided, the cross-sectional images must be measured and then the profile must be measured.

SUMMARY OF THE INVENTION

Accordingly, the present invention is directed to a wafer and a method for analyzing the shape thereof that substantially obviate one or more problems due to limitations and disadvantages of the related art.

An object of the present invention is to provide a method for analyzing the shape of a wafer by measuring the profile of a bevel portion of the edge region of the wafer, and thereby to provide a wafer having excellent quality by minimizing the amount of a thin film layer that is left behind after a thin film layer removal process.

Another object of the present invention is to provide a method for analyzing the shape of a wafer in which a variable causing error occurrence in analysis of the shape of the wafer is small.

Yet another object of the present invention is to provide a method for analyzing the shape of a wafer which may be applied to both a flat-type wafer having the flat edge and a round-type wafer having the round edge.

A further object of the present invention is to provide a method for analyzing the shape of a wafer in which a thickness profile may be measured without dividing the edge region of the wafer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for analyzing a shape of a wafer includes measuring external shapes of a plurality of wafers, detecting a first point having a maximum curvature in an edge region of each wafer from measured values acquired in the measuring the external shapes of the wafers, detecting a second point spaced apart from the first point in a direction towards an apex of a corresponding one of the wafers, measuring a first angle formed between a first line configured to connect the first point and the second point and a front side of the corresponding one of the wafers, forming a thin film layer on a surface of each wafer, measuring a thickness profile of the thin film layer, and confirming a wafer in which a maximum value of the thickness profile of the thin film layer is the smallest among the wafers.

The first point may be a point configured to have a minimum (1/R) value in the edge region of each wafer, and R may be a curvature of the surface of the corresponding one of the wafers at the point.

The first point may be a point configured to have a minimum second-order differential value of location coordinates on the surface of each wafer in the edge region.

A height difference between the first point and the second point may be proportional to a second-order differential value of location coordinates on the surface of the corresponding one of the wafers at the first point.

The height difference between the first point and the second point may satisfy an equation $H=\alpha \times (1/R)^2$ and, here, H may be the height difference, $\alpha$ may be an arbitrary constant and R may be a curvature of the corresponding one of the wafers at the first point.

The second point may be located at a position spaced apart horizontally from an apex of the edge region of the corresponding one of the wafers in a direction towards a bulk region by a distance within about 0.5 μm.

In another aspect of the present invention, a wafer includes a bulk region, a front side and a back side of the bulk region configured to face each other in parallel, and an edge region disposed at an edge of the bulk region, wherein the edge region includes a bevel portion and an apex disposed at an edge thereof, wherein the bevel portion includes a first point having a maximum curvature and a second point spaced apart from the first point in a direction towards the apex, the first point and the second point configured to be sequentially disposed in a direction towards the apex from the front side, and a height difference between the first point and the second point is proportional to a second-order differential value of location coordinates on a surface of the wafer at the first point.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings.

However, the embodiments of the present invention may be implemented in various different forms, and the scope of the present invention is not limited to the embodiments disclosed hereinafter. The embodiments of the present invention are provided to make the description of the present invention thorough and to fully convey the scope of the present invention to those skilled in the art.

In addition, it will be understood that, although the relational terms "first", "second", "on/above" and "under/below", etc. may not always require or encompass any physical or logical relations between substances or elements or the order thereof, and be used only to distinguish any substance or element from other substances or elements.

First, a method for fabricating a wafer according to one embodiment of the present invention will be described.

In more detail, a silicon single crystal substrate is manufactured through a single crystal growth process for making an ingot through a Czochralski method, a slicing process for acquiring a thin circular wafer by slicing the single crystal ingot, a grinding process for processing the outer circumferential portion of the wafer acquired by the slicing process so as to prevent the wafer from being broken or distorted, a lapping process for removing remaining damage from the wafer due to mechanical machining, a polishing process for smoothing the surface of the wafer, a cleaning process for removing an adhesive or foreign substances from the polished wafer, etc.

Thereafter, the shape of the wafer is analyzed through a method for analyzing the shape of a wafer according to one embodiment of the present invention.

Hereinafter, among the shapes of the wafer, such as the edge of the wafer, the surface of the wafer, the back side of the wafer, etc., which may be acquired through images, the edge of the wafer will be exemplarily described, but this embodiment may be applied to other shapes of the wafer, i.e., the surface of the wafer and the back side of the wafer, in addition to the edge of the wafer.

Figure 2A:
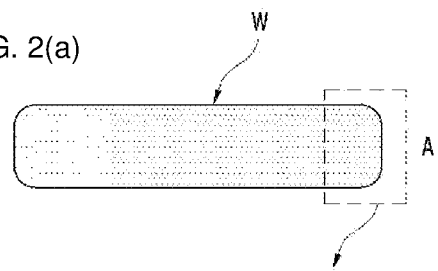
FIGS. 2(a) and 2(b) are views illustrating a wafer, the shape of which is to be analyzed, according to one embodiment of the present invention.
Figure 2B:
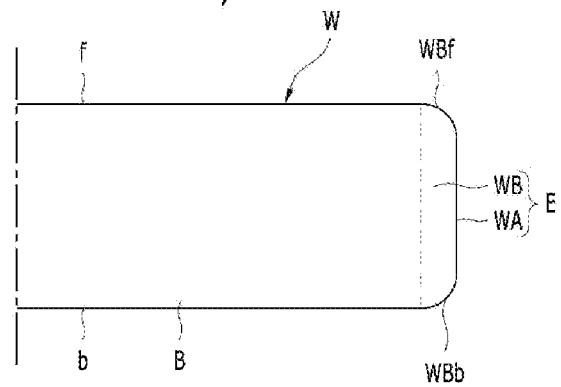
Figure 3:
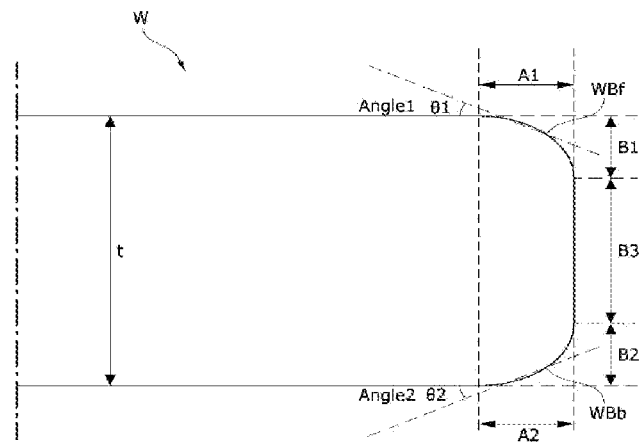
FIG. 3 is an enlarged cross-sectional view of the wafer shown in FIGS. 2(a) and 2(b)

FIGS. 2(a) and 2(b) are views illustrating a wafer, the shape of which is to be analyzed, according to one embodiment of the present invention, and FIG. 3 is an enlarged cross-sectional view of the wafer shown in FIGS. 2(a) and 2(b).

Referring to FIGS. 2(a) and 2(b), a wafer W may be divided into a bulk region B, a front side f, a back side b, and an edge region E disposed at the edge of the bulk region B.

FIG. 2(b) illustrates a portion of the wafer W, i.e., the portion 'A', in more detail.

The bulk region W occupies the majority of the wafer W, the upper surface of the bulk region W may be referred to as the front side f, and the lower surface of the bulk region W may be referred to as the back side b.

Further, the edge region E may be divided into a bevel portion WB and an apex WA. The upper surface of the bevel portion WB may be referred to as a bevel front side WBf, and the lower surface of the bevel portion WB may be referred to as a bevel back side WBb.

The wafer W shown in FIG. 2 is a flat-type wafer, the shape of the edge region E of which is flat, and a round-type wafer may have a rounded edge contour instead of the flat apex WA of FIG. 2.

In FIG. 3, the thickness of the bulk region B of the wafer W may be defined as 't', the height or thickness of the apex WA may be defined as 'B3', the height or thickness of the bevel front side WBf may be defined as 'B1' and the height or thickness of the bevel back side WBb may be defined as 'B2'.

Further, the length or width of the bevel front side WBf in the horizontal direction may be defined as 'A1', and the length or width of the bevel back side WBb in the horizontal direction may be defined as 'A2'. Here, although the sizes of B1 and B2 may be the same as each other and the sizes of A1 and A2 may be the same as each other, they may differ somewhat from each other in consideration of errors in a fabrication process.

In addition, an angle 1 $\theta 1$ is formed by the front side f of the wafer W and the bevel front side WBf, and an angle 2 $\theta 2$ is formed by the back side b of the wafer W and the bevel back side WBb. Here, although the angle 1 $\theta 1$ and the angle 2 $\theta 2$ may be the same as each other, they may differ somewhat from each other in consideration of errors in the fabrication process.

In FIG. 3, dotted lines extending from the bevel front side WBb and the bevel back side WBb of the wafer W may be tangent lines on the bevel front side WBb and the bevel back side WBb, respectively. Further, the tangent lines may be tangent lines at designated points of the bevel front side WBb and the bevel back side WBb of the wafer W, or tangent lines which respectively connect two points, as will be described below with reference to FIG. 4.

The cross-sectional shape of the wafer fabricated through the above-described process will be measured as follows, and here, the cross-sectional shapes of a plurality of wafers may be measured using the same method. In more detail, the profile of the edge region of the wafer is measured by measuring the surface of the wafer using an optical apparatus, and then the cross-sectional shape may be analyzed.

Figure 4:
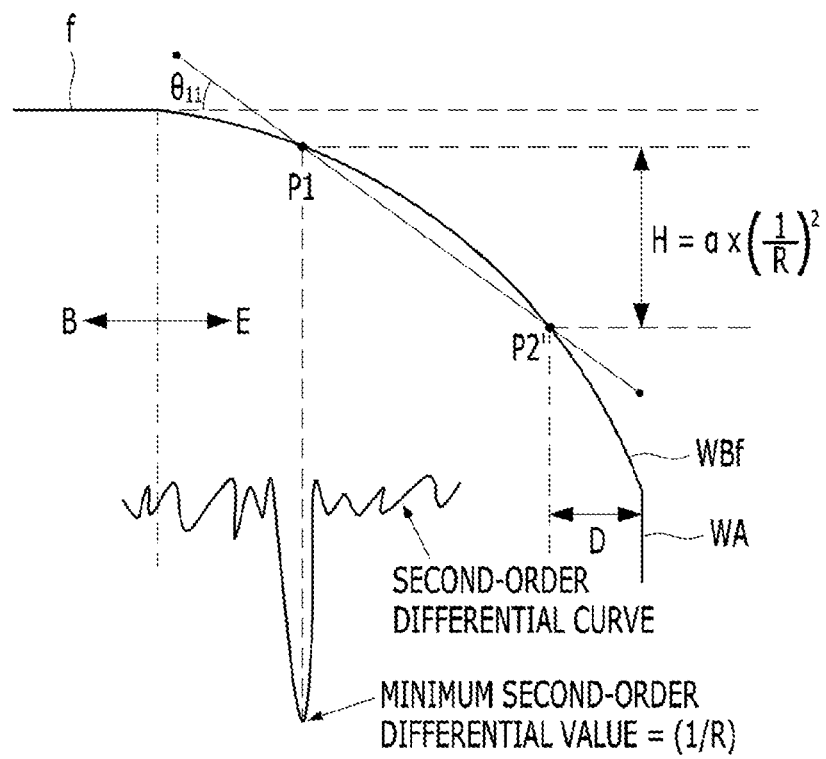
FIG. 4 is a view illustrating a reference point and first and second points of a bevel portion of the wafer.

FIG. 4 is a view illustrating a reference point, a first point and a second point on the bevel portion.

The wafer of FIG. 4 is a flat-type wafer, the shape of the edge region E of which is flat, and a portion of the front side f in the bulk region B of the wafer and the bevel front side WBf and a portion of the apex WA in the edge region E are illustrated.

The bevel front side WBf in the edge region E forms a curved surface. A first point P1 and a second point P2' are located on the bevel front side WBf from the bulk region B.

The first point P1 may be a point on the bevel front side WBf which has the maximum curvature. The point having the maximum curvature may be detected by measuring the curvatures of respective points on the bevel front side WBf, or be set to a point having the minimum second-order differential value, acquired by calculating the second-order differential values of profiles of the location coordinates of the respective points on the bevel front side WBf. Here, the point having the maximum curvature and the point having the minimum second-order differential value respectively mean a point on the bevel front side WBf at which the surface of the wafer has the maximum curvature and a point of the bevel front side WBf at which the surface on the wafer has the minimum second-order differential value of location coordinates. Further, the point at which the surface of the wafer has the maximum curvature may be a point at which the surface of the wafer has the minimum radius of curvature.

The second point P2' may be a point on the bevel front side WBf which is adjacent to the first point P1. A height difference H between the first point P1 and the second point P2' may be proportional to the second-order differential value (1/R) of the location coordinates of the first point P1. More specifically, the height difference H between the first point P1 and the second point P2' may be $\alpha \times (1/R)^2$ and, here, $\alpha$ may be an arbitrary constant and R may be the curvature of the first point P1.

Further, a horizontal distance D between the apex WA and the second point P2' in the edge region E of the wafer may be within about 0.5 µm.

Referring to FIG. 4, a line 1-1 which connects the first point P1, which is the point having the minimum radius of curvature on the bevel front side WBf in the edge region E of the wafer, i.e., the point having the maximum curvature, to the second point P2' is measured. Further, an angle 1-1($\theta_{11}$) formed by the line 1-1 and the front side f of the bulk region B of the wafer is measured.

In order to avoid confusion with the angle 1 $\theta 1$ and the angle 2 $\theta 2$ shown in FIG. 3, the angle 1-1($\theta_{11}$) is shown in FIG. 4. The angle 1 $\theta 1$ and the angle 2 $\theta 2$ shown in FIG. 3 may be measured through various methods, but the angle 1-1($\theta_{11}$) shown in FIG. 4 may be measured using the first point P1 and the second point P2'.

Thereafter, a thin film layer may be formed on the surfaces of respective wafers through a method such as deposition.

Thereafter, the thickness profiles of the edge regions of the wafers having the thin film layer formed thereon may be measured. Here, the thickness profiles of the edge regions of the wafers may be measured through a nondestructive method using the optical apparatus.

Thereafter, among the wafers, the wafer in which the maximum value of the thickness profile of the thin film layer is the smallest may be confirmed. The thin film layer deposited on the surface of the wafer may exhibit the maximum value of the thickness profile, particularly, on the above-described bevel portion or on the front side of the bulk region adjacent to the bevel portion and, as the maximum value of the thickness profile is decreased, the quality of the fabricated wafer may be improved and the likelihood of occurrence of defects of semiconductor devices may be decreased.

Here, in consideration of the fact that the shape of the first point P1 having the maximum curvature in the above-described bevel portion may have the greatest effect on the thickness profile of the thin film layer but it is difficult to accurately measure the slope of a tangent line at the first point P1, a tangent line which connects the first point P1 and the second point P2' may be measured and an angle formed by the measured tangent line and the front side of the bulk region of the wafer may be measured instead.

Figure 1:
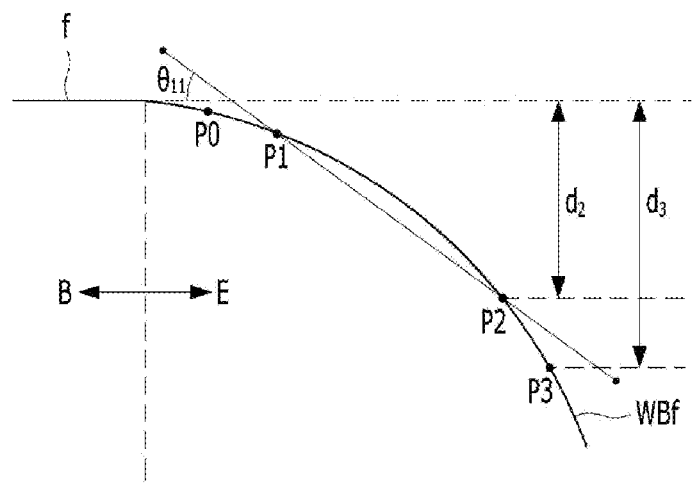
FIG. 1 is a view illustrating a conventional method for analyzing the shape of a wafer.

Table 1 below states correlations between the thickness of the photoresist and the angle 1-1 when the shapes of wafers are analyzed through the conventional method described above with reference to FIG. 1, and correlations between the thickness of the photoresist and the angle 1-1 when the shapes of wafers are analyzed through the method according to the above-described embodiment of the present invention.

TABLE 1

| | | Flat-type | | | Round-type | |
|---|---|---|---|---|---|---|
| | | Group 1 | Group 2 | Group 3 | Group 4 | |
| Apparatus | Subject | 17 | 17 | 10 | 7 | Total |
| A | Example | 82 | 82 | 88 | 87 | 90 |
| | Comparative example 1 | 64 | 37 | 84 | — | 57 |
| B | Comparative example 2 | 52 | 70 | 46 | 80 | 44 |

In Example and in Comparative Example 1, the shapes of the edges of the wafers were analyzed through the method according to the above-described embodiment of the present invention and the conventional method and, here, the apparatus A may be nondestructive measurement equipment using an optical apparatus. As a result of analysis of the shapes of the edge regions of 17 wafers of a group 1, 17 wafers of a group 2, and 10 wafers of a group 3, which correspond to flat-type wafers, and 7 wafers of a group 4, which correspond to round-type wafers, the correlations between the thickness of the photoresist and the angle 1-1 were about 90 and about 57 on the whole.

In Comparative Example 2, the shapes of the edges of the wafers were analyzed through the conventional method and, here, the apparatus B may be, for example, a scanning electron microscope (SEM). As a result of analysis of the shapes of the edge regions of 17 wafers of the group 1, 17 wafers of the group 2, and 10 wafers of the group 3, which correspond to flat-type wafers, and 7 wafers of the group 4, which correspond to round-type wafers, the correlation between the thickness of the photoresist and the angle 1-1 was about 44 on the whole.

Figure 5:
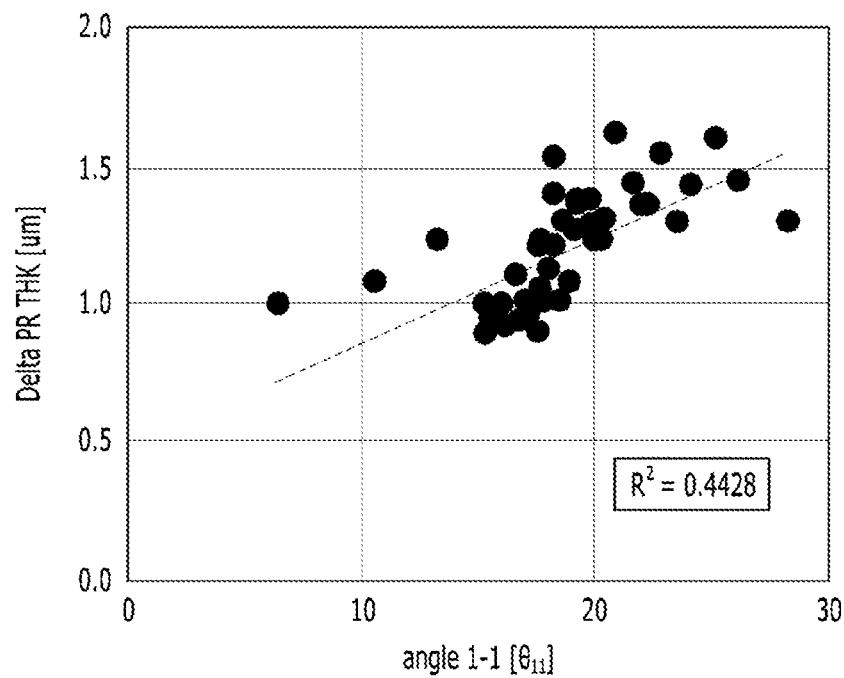
FIG. 5 is a graph representing a correlation between the thickness of a photoresist and an angle 1-1 in the conventional method.
Figure 6:
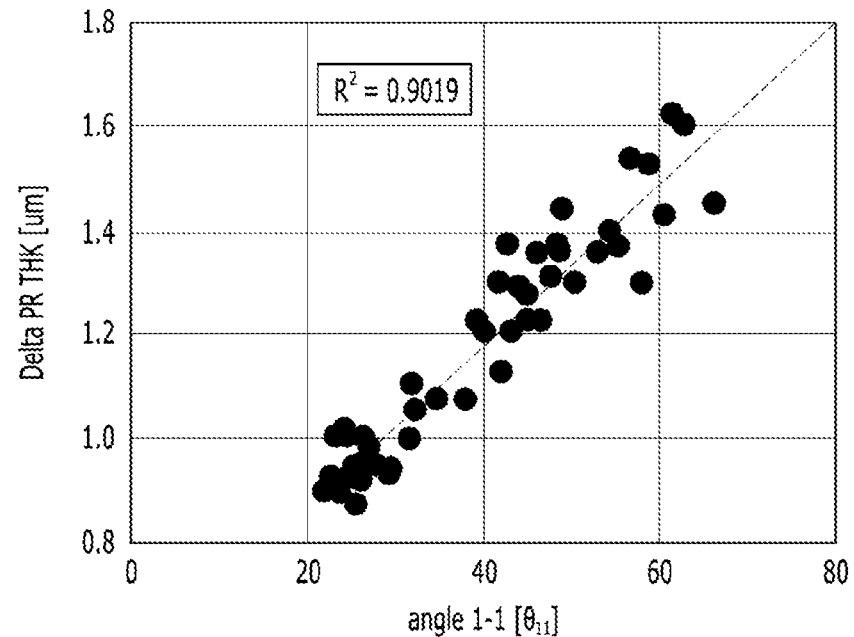
FIG. 6 is a graph representing a correlation between the thickness of a photoresist and an angle 1-1 in the method according to one embodiment of the present invention.

FIG. 5 is a graph representing the correlation between the thickness of the photoresist and the angle 1-1 in the conventional method, and FIG. 6 is a graph representing the correlation between the thickness of the photoresist and the angle 1-1 in the method according to one embodiment of the present invention.

In the respective graphs, the horizontal axis indicates the angle 1-1($\theta_{11}$), and the vertical axis indicates the thickness of the photoresist.

FIG. 5 represents Comparative Example 2 of Table 1, and, in respective samples, a coefficient of determination $R^2$ indicating the correlation between the thickness of the photoresist PR and the angle 1-1($\theta_{11}$) is 0.4428, and FIG. 6 represents Example of Table 1 and, in respective samples, a coefficient of determination $R^2$ indicating the correlation between the thickness of the photoresist PR and the angle 1-1($\theta_{11}$) is 0.9019.

That is, compared to Comparative Example 2 shown in FIG. 5, in the method according to the embodiment of the present invention, the thickness of the photoresist tends to increase rapidly as the angle 1-1 increases, and thus, the photoresist may be prevented from being deposited to a great thickness on the wafer, particularly at the first point P1 in the edge region E, by adjusting the thickness of the angle 1-1.

That is, in the wafer fabrication process, the angle 1-1 ($\theta_{11}$) may be controlled through an edge-grinding process, an edge-polishing process, or a double side-polishing process.

By analyzing the shapes of the wafers using the above-describe method, when a thin film layer is deposited on the wafers in post-processing, the wafer having the smallest thickness of the thin film layer, particularly, having the smallest maximum value of the thickness of the thin film layer, among the wafers may be defined below.

A wafer may have a bulk region including a front side and a back side which are formed on the upper and lower surfaces thereof so as to face each other in parallel, and an edge region disposed at the edge of the bulk region. The edge region may include a bevel portion and an apex disposed at the edge thereof, the bevel portion may include a first point having the maximum curvature and a second point spaced apart from the first point in the direction towards the apex, and the first point and the second point may be sequentially disposed in the direction towards the apex from the front side. This definition may be applied to a round-type wafer having an edge region having a rounded edge contour, in addition to the flat-type wafer having the edge region having the flat apex.

Figure 7:
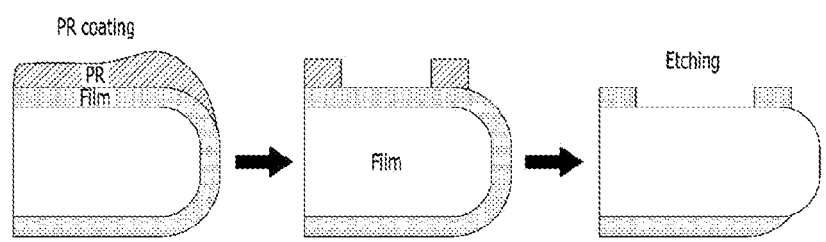
FIG. 7 is a view illustrating a thin film deposition process and an etching process performed on the wafer.

FIG. 7 is a view illustrating a thin film deposition process and an etching process on the wafer.

After the thin film layer is deposited on the wafer and the photoresist is coated thereon, the thin film layer may be removed through a method such as etching. After the etching process, it may be confirmed that the thin film layer is left in a region adjacent to the edge region or the bevel portion of the wafer. In the case of the wafer having the above-described profile of the bevel portion, the thin film layer left in the region adjacent to the edge region or the bevel portion of the wafer may be minimized.

As is apparent from the above description, in a method for analyzing the shape of a wafer according to one embodiment of the present invention, only two points are defined in the edge region of the wafer, i.e., a first point having the maximum curvature and a second point spaced apart from the first point by a designated distance are set, a tangent line configured to connect the first point and the second point is measured, an angle formed between the tangent line and the front side of the bulk region of the wafer is measured, and thus, a thin film layer may be formed on the wafer to a small thickness by adjusting the angle formed between the tangent line and the front side of the bulk region of the wafer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

Therefore, the scope of the present invention is defined not by the detailed description, but by the claims and their equivalents, and all variations within the scope of the claims and their equivalents are to be construed as being included in the present disclosure.

What is claimed is:

1. A wafer comprising:

a bulk region;

a front side and a back side of the bulk region configured to face each other in parallel; and an edge region disposed at an edge of the bulk region, wherein the edge region comprises a bevel portion and an apex disposed at an edge thereof, wherein:

the bevel portion comprises a first point having a maximum curvature and a second point spaced apart from the first point in a direction towards the apex, the first point and the second point configured to be sequentially disposed in a direction towards the apex from the front side; and a height difference between the first point and the second point is proportional to a second-order differential value of location coordinates on a surface of the wafer at the first point.

2. The wafer according to claim 1, wherein the first point is a point configured to have a minimum second-order differential value of location coordinates on the surface of the wafer in the edge region.

3. The wafer according to claim 1, wherein the first point is a point configured to have a minimum (1/R) value in the edge region of the wafer, wherein R is a curvature of the surface of the wafer at the point.

4. The wafer according to claim 1, wherein a height difference between the first point and the second point satisfies an equation $H=\alpha \times (1/R)^2$, wherein H is the height difference, a is an arbitrary constant, and R is a curvature of the first point.

5. The wafer according to claim 1, wherein the second point is located at a position spaced apart horizontally from an apex of the edge region of the wafer in a direction towards the bulk region by a distance within about 0.5 μm.

* * * * *